United States Patent
Kuczynski et al.

(10) Patent No.: US 9,257,764 B2
(45) Date of Patent: Feb. 9, 2016

(54) LOW INSERTION FORCE CONNECTOR UTILIZING DIRECTIONAL ADHESION

(71) Applicant: International Business Machines Corporation, Armonk, NY (US)

(72) Inventors: Joseph Kuczynski, North Port, FL (US); Chelsie M. Peterson, Dexter, MN (US); Mark D. Plucinski, Rochester, MN (US); Timothy J. Tofil, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 42 days.

(21) Appl. No.: 14/156,553

(22) Filed: Jan. 16, 2014

(65) Prior Publication Data

US 2015/0200480 A1    Jul. 16, 2015

(51) Int. Cl.
*H01R 12/00* (2006.01)
*H01R 12/71* (2011.01)
*H05K 7/10* (2006.01)

(52) U.S. Cl.
CPC .............. *H01R 12/714* (2013.01); *H05K 7/10* (2013.01); *H05K 7/1061* (2013.01)

(58) Field of Classification Search
CPC ......... H01R 12/00; H01R 13/24; H01R 24/00
USPC ............ 439/66, 77, 591, 700, 259, 626, 482; 257/738
See application file for complete search history.

(56) References Cited

U.S. PATENT DOCUMENTS

| | | | | |
|---|---|---|---|---|
| 4,705,205 | A | * 11/1987 | Allen | B23K 3/06 228/180.22 |
| 5,041,183 | A | * 8/1991 | Nakamura | H01R 4/04 156/264 |
| 5,098,311 | A | 3/1992 | Roath et al. | |
| 5,176,530 | A | 1/1993 | Reylek et al. | |
| 5,324,205 | A | * 6/1994 | Ahmad | H01R 12/714 439/66 |
| 5,569,045 | A | 10/1996 | Hsu | |
| 5,794,330 | A | * 8/1998 | Distefano | H01L 21/486 228/180.22 |
| 5,938,455 | A | 8/1999 | Glovatsky et al. | |
| 6,206,715 | B1 | 3/2001 | Liu et al. | |
| 6,374,328 | B1 | 4/2002 | Rhinehart | |
| 6,471,538 | B2 | * 10/2002 | Zhou | G01R 1/06711 257/E23.021 |
| 6,561,819 | B1 | * 5/2003 | Huang | H05K 7/1069 439/66 |
| 6,624,639 | B2 | 9/2003 | Schiffer | |
| 6,669,490 | B1 | * 12/2003 | DelPrete | H01R 12/52 439/66 |
| 6,734,548 | B1 | * 5/2004 | Tran | H05K 7/1007 257/678 |

(Continued)

OTHER PUBLICATIONS

Tokoku, Chihiro et al., "Tohoku University Focal Plane Array Controller (TUFPAC)", Astronomical Institute, Tohoku University, Aoba, Sendai 980-8578, Japan, Mar. 2003.

(Continued)

*Primary Examiner* — Abdullah Riyami
*Assistant Examiner* — Nader J Alhawamdeh
(74) *Attorney, Agent, or Firm* — Toler Law Group, PC

(57) ABSTRACT

An electrically conductive connector includes a columnar structure with a slanted contact surface. The columnar structure is electrically coupled to a first circuit member. An electrical conduction path is established between the first circuit member and a second circuit member when the slanted contact surface of the columnar structure mates with a contact surface of the second circuit member via van der Waals forces.

20 Claims, 6 Drawing Sheets

(56) References Cited

U.S. PATENT DOCUMENTS

| | | | |
|---|---|---|---|
| 6,932,618 B1* | 8/2005 | Nelson | H01R 13/03 439/66 |
| 7,099,525 B2* | 8/2006 | Bakir | G02B 6/12002 385/14 |
| 7,253,514 B2* | 8/2007 | Legen | H01L 24/10 257/629 |
| 7,402,053 B2 | 7/2008 | Hougham et al. | |
| 7,427,809 B2* | 9/2008 | Salmon | H01L 21/4853 257/719 |
| 7,458,816 B1* | 12/2008 | Mathieu | G01R 1/07342 439/66 |
| 7,530,814 B2* | 5/2009 | Ramaswamy | H01R 13/2442 439/66 |
| 8,133,061 B1* | 3/2012 | Ayers, Sr. | H01R 12/714 439/66 |
| 8,531,821 B2* | 9/2013 | Holzman | H05K 3/3436 361/676 |
| 8,934,259 B2* | 1/2015 | Bower | H01L 21/563 257/782 |
| 2002/0155735 A1* | 10/2002 | Zhou | G01R 1/06711 439/66 |
| 2003/0092304 A1 | 5/2003 | Whyne et al. | |
| 2003/0114035 A1 | 6/2003 | Tran | |
| 2003/0186566 A1* | 10/2003 | Maruyama | G01R 1/0675 439/66 |
| 2004/0115994 A1* | 6/2004 | Wulff | H01R 13/2471 439/700 |
| 2004/0147156 A1 | 7/2004 | Renfro et al. | |
| 2005/0042894 A1* | 2/2005 | Wu | G11B 5/4806 439/66 |
| 2007/0105406 A1* | 5/2007 | Li | H01R 13/2435 439/66 |
| 2008/0009149 A1* | 1/2008 | Arms | H01Q 1/2208 439/66 |
| 2008/0032518 A1* | 2/2008 | Graetz | H05K 1/0263 439/66 |
| 2008/0197493 A1* | 8/2008 | Geyer | H01L 24/11 257/738 |
| 2009/0004890 A1* | 1/2009 | Chiu | H01R 13/2407 439/66 |
| 2009/0029568 A1* | 1/2009 | Ju | H05K 7/1069 439/66 |
| 2009/0042413 A1* | 2/2009 | Ma | H01R 12/716 439/66 |
| 2011/0159737 A1* | 6/2011 | Lin | H01R 12/7082 439/626 |
| 2011/0203838 A1* | 8/2011 | MacDougall | H01R 12/52 174/257 |
| 2011/0316173 A1* | 12/2011 | Patti | B82Y 10/00 257/784 |
| 2012/0202390 A1* | 8/2012 | Park | H01R 12/714 439/700 |
| 2012/0314388 A1* | 12/2012 | Bower | H01L 21/563 361/760 |
| 2013/0210276 A1* | 8/2013 | Rathburn | 439/620.22 |
| 2013/0260578 A1* | 10/2013 | Mason | H01R 12/714 439/66 |
| 2013/0267103 A1* | 10/2013 | Kuwahara | H01R 12/7082 439/66 |
| 2013/0337666 A1* | 12/2013 | Walczyk | H01R 12/712 439/66 |

OTHER PUBLICATIONS

Koziol, Scott et al., "Hardware and Software Infrastructure for a family of Floating-Gate Based FPAAs", Proceedings of 2010 IEEE International Symposium on Circuits and Systems (ISCAS), May 2010, Atlanta, Georgia.

Kim, Sangbae et al., "Smooth Vertical Surface Climbing With Directional Adhesion", IEEE Transactions on Robotics, vol. 24, No. 1, Feb. 2008.

* cited by examiner

LOW INSERTION FORCE CONNECTOR UTILIZING DIRECTIONAL ADHESION

I. FIELD

The present disclosure is generally related to an electrically conductive connector.

II. DESCRIPTION OF RELATED ART

Advances in technology have resulted in smaller and more powerful computing devices. One of the advances is a rapid increase of interconnection densities (i.e., a number of interconnections in a circuit board assembly) in circuit board assemblies. Land grid array (LGA) connectors may be used for high interconnection density assemblies. The LGA connectors establish electrical connections between two devices (e.g., circuit boards) by aligning contact arrays of mating surfaces of the devices and a conductive interposer device and mechanically compressing them against each other.

LGA connection technology has several challenges. When circuit boards are assembled, large compressive forces (e.g., in a magnitude of one thousand Newtons) may be applied to the circuit boards to achieve a specific degree of conductivity. The magnitude of the compressive forces may depend on the number of connections and loading characteristics of individual contacts on the circuit boards. Since the compressive forces are applied in three dimensions, stress on the individual contacts may not be uniform. Non-uniform stress may damage the individual contacts on the circuit boards. In addition, relative motions of the circuit boards during operation may wear away a surface material (e.g., gold), which may expose and oxidize an underlying layer material (e.g., silver) and/or a base material (e.g., copper). As a result, an accumulation of the oxide between the contact surfaces of the circuit boards may lead to a failure of electrical connections between the circuit boards.

III. SUMMARY

This disclosure presents particular embodiments of an electrically conductive connector that is configurable to bond contact surfaces of a circuit member (e.g., a first electrical device or a first circuit board) with contact surfaces of another circuit member (e.g., a second electrical device or a second circuit board) via van der Walls forces (i.e., inter-molecular forces). Thus, electrical conduction paths may be established between the two circuit members with relatively low insertion force.

In a particular embodiment, an electrically conductive connector includes a plurality of columnar structures (e.g., cylindrical stalks) with slanted contact surfaces. The columnar structures are made of flexible materials (e.g., a polymer). The columnar structures are plated with an electrically conductive material (e.g., gold). The columnar structures are attached to and electrically coupled to a circuit member. When the slanted contact surfaces of the columnar structures are brought into contact with contact surfaces (e.g., contact pads) of another circuit member, van der Walls forces may hold the contact surfaces of the two circuit members together, and thus electrical conduction paths are established between the two circuit members.

In another particular embodiment, a method of interconnecting circuit members includes engaging a circuit member with another circuit member so that slanted contact surfaces of columnar structures in one of the circuit members are in physical contact with contact surfaces of the other circuit member. The method also includes sliding one circuit member relative to the other circuit member so that the contact surfaces of the two circuit members are mated together via van der Walls forces, and thus electrical conduction paths are established between the two circuit members.

In another particular embodiment, a method of disconnecting circuit members includes sliding a circuit member relative to another circuit member in a direction that is opposite to a direction along which the two circuit members are slid to be mated. As a result, contact surfaces of the two circuit members are unmated. The method also includes disengaging the two circuit members so that electrical conduction paths between the two circuit members are disconnected.

One particular advantage provided by at least one of the disclosed embodiments is that an electrically conductive connector is capable of interconnecting circuit members with relatively low (e.g., zero) compressive force. Likewise, the electrically conductive connector is capable of disconnecting the circuit members with relatively low (e.g., zero) tensile force. Thus, damage to the circuit members resulting from a high compressive or tensile force by using conventional connectors may be avoided.

Another particular advantage provided by at least one of the disclosed embodiments is that an electrically conductive connector may reduce corrosion. Since the electrically conductive connector is made of a flexible material, relative motions during operation do not wear away a conductive material (e.g., gold) on contact surfaces of circuit members. Thus, oxidation of an underlying layer material (e.g., nickel) and/or a base material (e.g., copper) may be avoided.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

Figure 2:
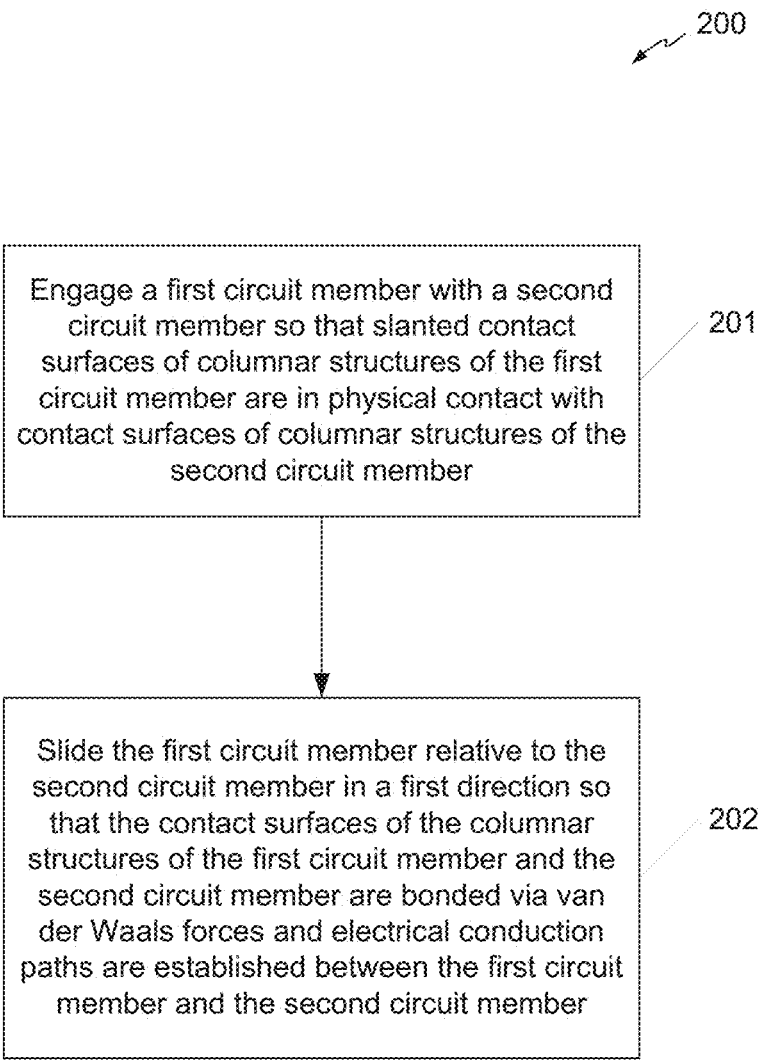
Figure 3:
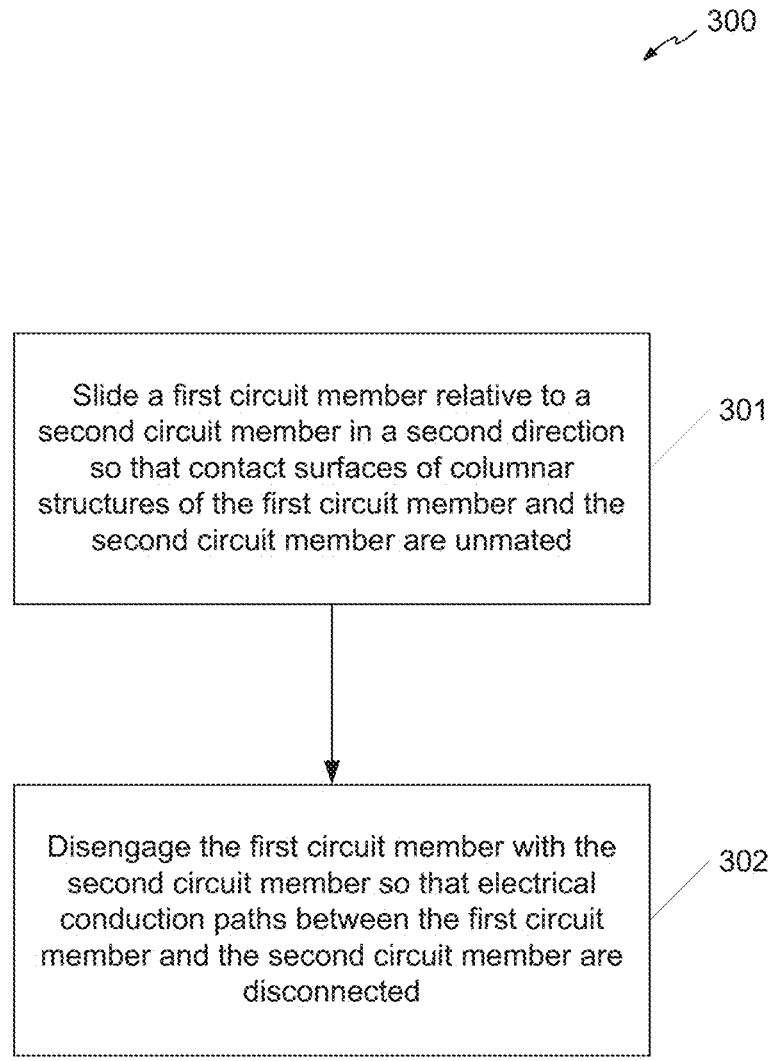

FIG. 2 is a flow chart of a particular embodiment of a method of using an electrically conductive connector to interconnect two circuit members via van der Waals forces and to establish electrical conduction paths between the two circuit members; and FIG. 3 is a flow chart of a particular embodiment of a method of unmating contact surfaces of two circuit members that are mated via van der Waals forces and disconnecting electrical conduction paths between the two circuit members.

V. DETAILED DESCRIPTION

This disclosure relates generally to an electrically conductive connector that is configurable to interconnect two circuit members (e.g., circuit boards) via van der Waals forces (i.e., inter-molecular forces) and thus to establish electrical conduction paths between the two circuit members. The electrically conductive connector may be attached to and electrically coupled to a circuit member. For example, in a land grid array (LGA) assembly, an electrically conductive connector may be attached to an underside of a LGA module and may be used to connect the LGA module with a LGA circuit board. The electrically conductive connector may mate contact surfaces of the LGA module and the LGA circuit board via van der Waals forces, and thus may establish electrical conduction paths between the LGA module and the LGA circuit board.

The electrically conductive connector may include one or more arrays of columnar structures (e.g., cylindrical stalks) with slanted contact surfaces. The columnar structures may be made of a flexible material (e.g., a polymer). The columnar structures may be plated with a conductive material (e.g., gold). When the slanted contact surfaces of the columnar structures are brought into physical contact with contact surfaces of another circuit member and slid relative to each other, inter-molecular bonds may be formed between the contact surfaces of the two circuit members and van der Waals forces may hold the two circuit members together. Thus, electrical conduction paths may be established between the two circuit members.

A method includes engaging a circuit member (e.g., a LGA module) with another circuit member (e.g., a LGA circuit board) so that slanted contact surfaces of columnar structures of one circuit member (e.g., the LGA module) may be in physical contact with contact surfaces of the other circuit member (e.g., the LGA circuit board). The method also includes sliding one circuit member relative to the other circuit member so that inter-molecular bonds are formed between the contact surfaces of the two circuit members and van der Waals forces holds the two circuit members together. As a result, electrical conduction paths may be established between the two circuit members. For example, to assemble a LGA assembly, an array of slanted contact surfaces on an underside of a LGA module may be brought into physical contact with a corresponding array of contact surfaces of contact pads on a LGA circuit board. The array of slanted contact surfaces on the LGA module may then be slid relative to the array of the contact surfaces of the contact pads on the LGA circuit board. Thus, inter-molecular bonds may be formed between the contact surfaces of the LGA module and the LGA circuit board and electrical conduction paths may be established between the LGA module and the LGA circuit board.

A method includes sliding a circuit member (e.g., a LGA module) relative to another circuit member (e.g., a LGA circuit board) in a direction that is opposite to a direction along which the two circuit members were slid to be mated. Sliding in the opposite direction releases the inter-molecular bonds between contact surfaces of the two circuit members such that van der Waals forces does not hold the two circuit members together any more. The method also includes disengaging one circuit member from the other circuit member. As a result, electrical conduction paths between the two circuit members are disconnected. For example, if a defect is discovered in either a LGA module or a LGA circuit board in a LGA assembly, the LGA module or the LGA circuit board may be removed from the LGA assembly for a replacement or a repair. The LGA module may be first slid relative to the LGA circuit board in a direction that is opposite to a direction used to assemble the LGA assembly. The LGA module and the LGA circuit board may then be taken apart. Thus, electrical conduction paths between the LGA module and the LGA circuit board may be disconnected.

Figure 1A:
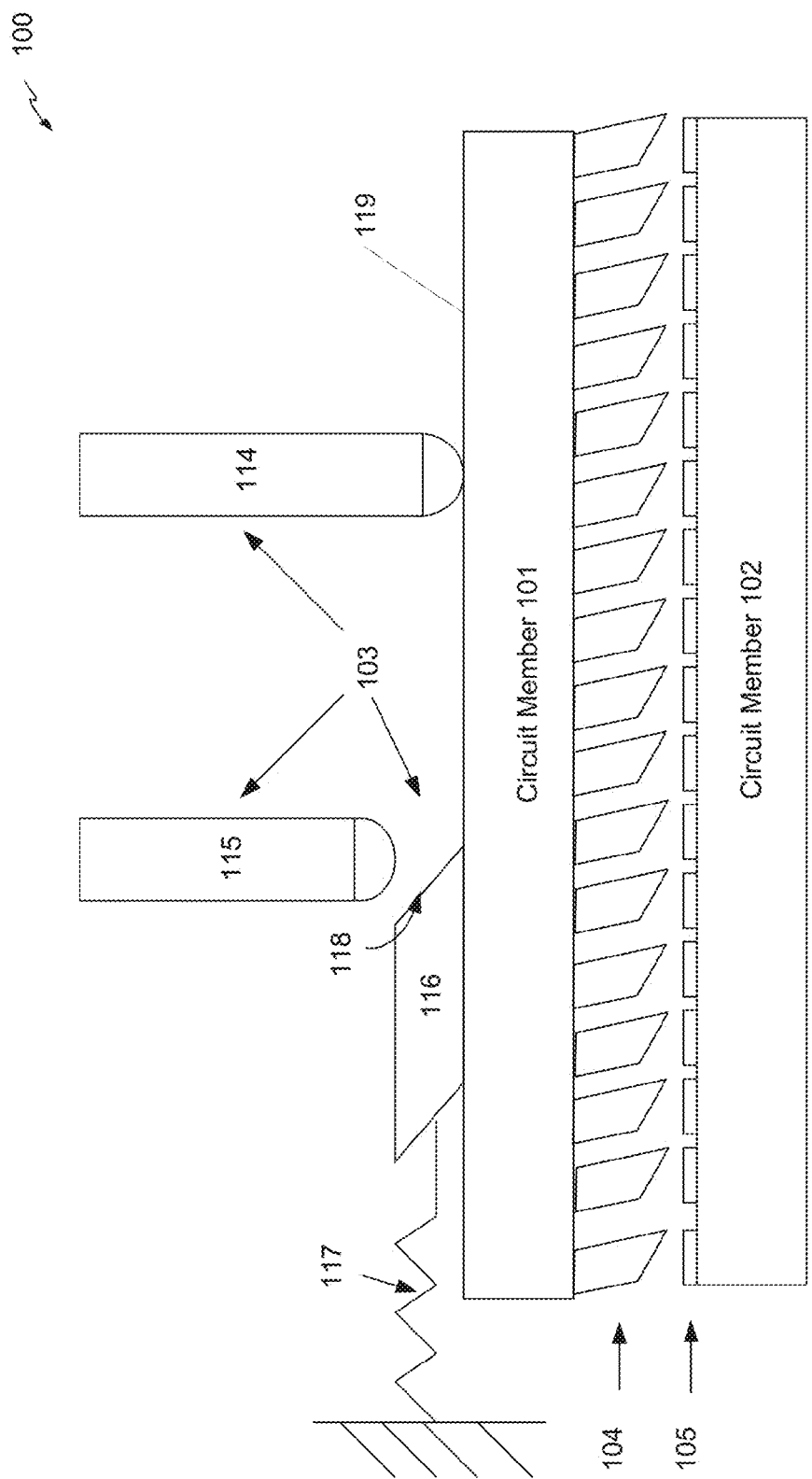
FIG. 1A is a diagram of a particular embodiment of a system that uses an electrically conductive connector to interconnect two circuit members via van der Waals forces and to establish electrical conduction paths between the two circuit members.

Referring to FIG. 1A, a diagram of a particular embodiment of a system that uses an electrically conductive connector to interconnect two circuit members via van der Waals forces and to establish electrical conduction paths between the two circuit members is disclosed and generally designated 100. In FIG. 1A, for purposes of illustration, the system 100 includes two circuit members 101 and 102 and a loading and unloading mechanism 103. In other embodiments, the system 100 may include multiple circuit members (e.g., more than two). The system 100 may also, or in the alternative, include additional devices. For example, when a high-performance module is used, the system 100 may include a heat sink. In a particular embodiment, a first circuit member 101 is electrically coupled to a second circuit member 102. The loading and unloading mechanism 103 may be configured to assemble and disassemble the circuit members 101 and 102. The system 100 may enable contact surfaces of the two circuit members 101 and 102 to be mated via van der Waals forces to establish electrical conduction paths between the circuit members 101 and 102.

The circuit members 101 and 102 may be electrical devices in an assembly. The electrical devices may include module packages (e.g., multichip modules) and circuit boards (e.g., integrated circuit boards). The module packages may include CPU packages, prototype or initial production modules that may undergo repeated rework, firmware modules that may be physically upgraded in the field, other devices, or a combination thereof. For example, a LGA assembly may include a LGA module and a LGA circuit board.

The circuit member 101 may include a first electrically conductive connector 104. The first electrically conductive connector 104 may be electrically coupled to circuits and/or devices on the circuit member 101. The circuit member 102 may include a second electrically conductive connector 105. The second electrically conductive connector 105 may be electrically coupled to circuits and/or devices on the circuit member 102. The first electrically conductive connector 104 may include one or more arrays of columnar structures and the second electrically conductive connector 105 may include corresponding contact surfaces. The circuit members 101 and 102 may be electrically interconnected enabling currents or signals to pass between the circuit members 101 and 102 after the columnar structures of the circuit member 101 are brought into physical contact with the corresponding contact surfaces of the circuit member 102.

Figure 1B:
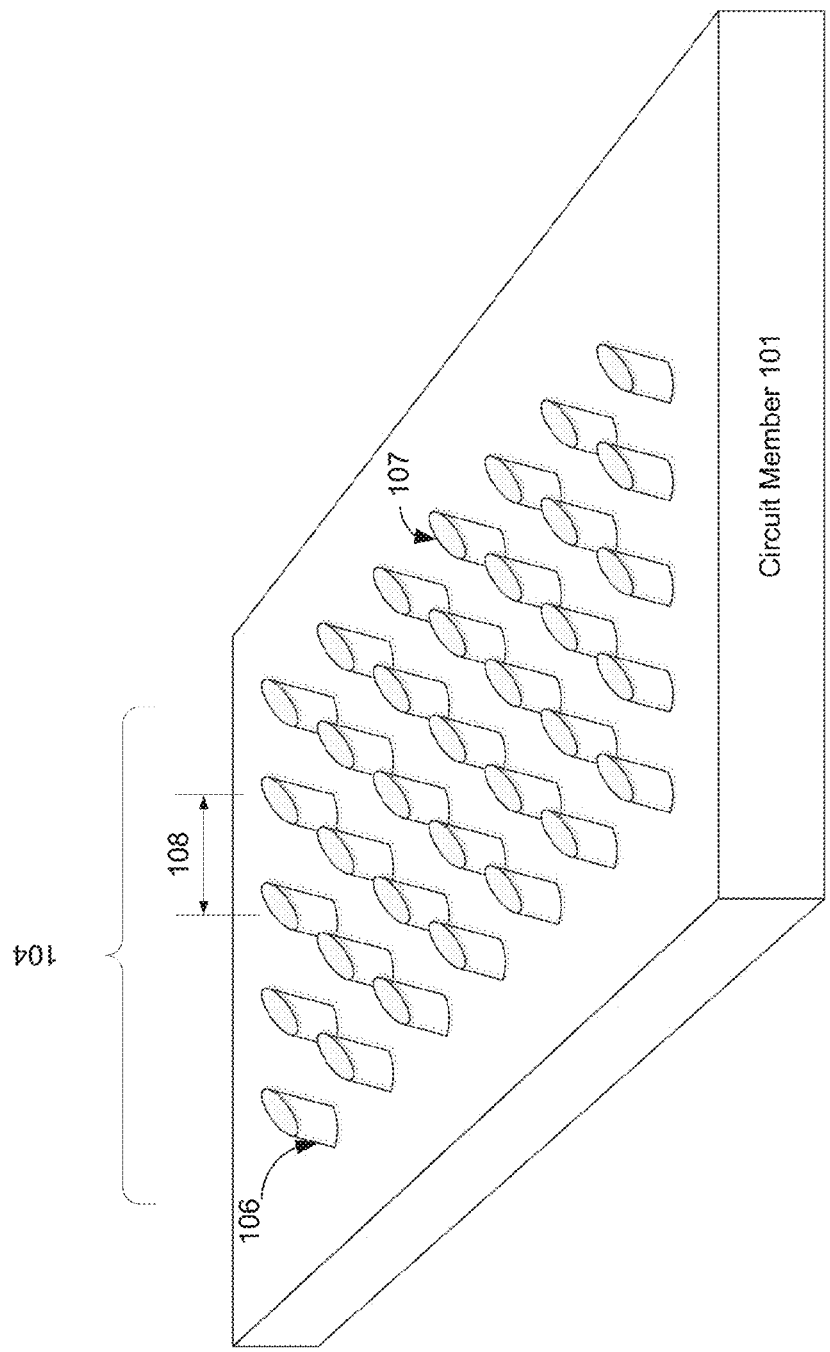
FIG. 1B is a perspective view of an electrically conductive connector of FIG. 1A illustrating an arrangement of columnar structures of the electrically conductive connector on a circuit member.

Referring to FIG. 1B, a perspective view of an electrically conductive connector of FIG. 1A illustrating an arrangement of columnar structures of the electrically conductive connector on a circuit member is shown. The electrically conductive connector 104 of FIG. 1A may include one or more arrays of columnar structures 106 with slanted contact surfaces 107. For purposes of illustration, FIG. 1B only shows one array of columnar structures 106. The columnar structures 106 may be in various shapes. For example, the columnar structures 106 are cylindrical stalks. As another example, the columnar structures 106 are rectangular prism stalks. The columnar structures 106 may be spaced based on a particular pin arrangement corresponding to a contact surface (e.g., a contact surface of the second electrically conductive connector 105 of FIG. 1A) to which the circuit member 101 is to be coupled. For example, when the system 100 of FIG. 1A is a LGA assembly, a distance between the columnar structures 106 may be approximately 1 millimeter.

Figure 1C:
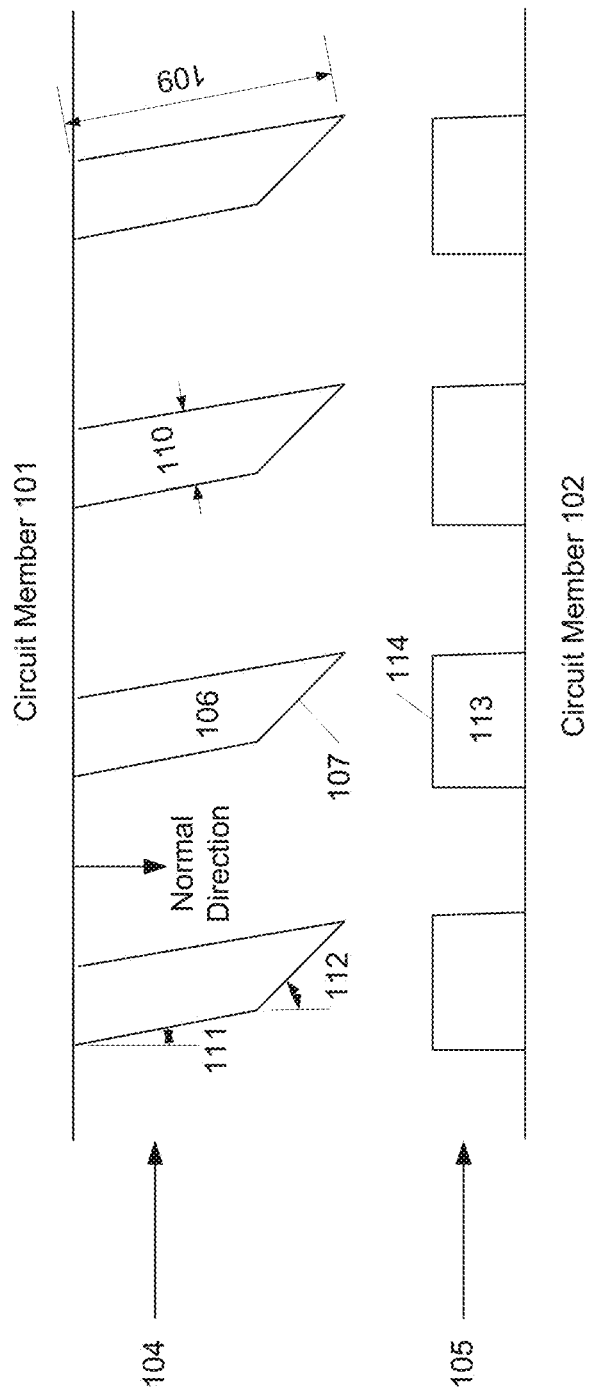
FIG. 1C is an enlarged side view of the electrically conductive connectors of FIG. 1A illustrating the columnar structures of the electrically conductive connectors before contact surfaces of two circuit members are brought into physical contact.

Referring to FIG. 1C, an enlarged side view of the electrically conductive connectors of FIG. 1A illustrating columnar structures of the electrically conductive connectors before contact surfaces of two circuit members are brought into physical contact is shown.

The columnar structures 106 may be made of a flexible material coated with a conductive material, such as a polymer. The polymer may include polyurethane, silicone, polydimethylsiloxane (PDMS), flexibilized epoxy resins, or acrylic resins. The elastic modulus of the polymer is preferably in the range of 0.5 2.0 MPa at 25° C. permitting the columnar stalk to deflect and make intimate contact with the mating surface. The columnar structures may be formed by pouring the polymer into a mold, curing the polymer, and then releasing the columnar structures. The mold may be made out of resin (e.g., Delrin® resin), silicone, wax, or another casting medium.

The columnar structures 106 may have a length 109 that may be determined based on design parameters, such as a magnitude of van der Waals forces. For example, the columnar structures 106 may have a length 109 within a range of from 500 to 1000 micrometers. In one embodiment, the columnar structures 106 have a length of approximately 750 micrometers. The columnar structures 106 may have a width 110 that may be determined based on design parameters, such as a magnitude of van der Waals forces or resistance. For example, the columnar structures 106 may have a width 110 within a range of from 100 to 500 micrometers. In one embodiment, the columnar structures 106 are in cylindrical stalks and have a diameter of approximately 380 micrometers. The columnar structures 106 may have an angle 111 from a normal direction of a surface of the circuit member 101. The angle 111 may be determined based on design parameters, such as a magnitude of van der Waals forces. For example, the angle 111 may be within a range of from 0 to 45 degrees. In one embodiment, the angle 111 is approximately 20 degrees. The slanted contact surfaces 107 of the columnar structures 106 may have an angle 112 from the normal direction of the surface of the circuit member 101. The angle 112 may be determined based on design parameters, such as a magnitude of van der Waals forces. For example, the angle 112 may be within a range of from 30 to 90 degrees. In one embodiment, the angle 112 is approximately 45 degrees.

The columnar structures 106 may be plated with a conductive material that has a low contact resistance, a good conductivity, and a high corrosive resistance. For example, the conductive material may include gold, silver, nickel over-plated with gold, or tin over-plated with silver. The conductive material may be formed on the columnar structures 106 by a film deposition process, such as chemical vapor deposition (CVD), spin-on, sputtering, or electroplating.

The columnar structures 106 may also, or in the alternative, be made of a composite that may include conductive material (e.g., metal particles, fibers, or wires) embedded in a matrix of elastomer. The elastomer may provide elasticity required by the columnar structures 106 when the first electrically conductive connector 104 and the second electrically conductive connector 105 are brought into physical contact and slid over each other. The elastomer enables the columnar structures 106 to accommodate a range of motions when the slanted contact surfaces of the columnar structures 106 are slid relative to contact surfaces 105 of the circuit member 102. Electrical conductivity may be provided by the conductive material in the elastomer.

Since the electrically conductive connector 104 is made of a flexible material, relative motions during assembling, disassembling, or operation do not wear away a conductive material (e.g., gold) plated on the flexible material and thus oxidize an underlying layer material (e.g., nickel) or a base material (e.g., copper) as in a conventional connector. Thus, using a flexible material in the columnar structures 106 enables the system 100 to reduce failures resulting from corrosion on contact surfaces 105 and 107 of the circuit members 101 and 102.

The second electrically conductive connector 105 may include one or more arrays of columnar structures 113 (e.g., cylindrical contact pads) with mating contact surfaces 105 that match the slanted contact surfaces 107 of the columnar structures 106 when the slanted contact surfaces 107 and the contact surfaces 105 are brought into physical contact. The dimensions and shapes of the columnar structures 113 of the second electrically conductive connector 105 may be designed to be compatible with corresponding dimensions and shapes of the columnar structures 106 of the circuit member 101. For example, the columnar structures 113 may be cylindrical contact pads to match the cylindrical stalks of the columnar structure 106. The columnar structures 113 may be made of a base material. The base material may include a first conductive material (e.g., copper) or a non-conductive material (e.g., a polymer). The base material may be coated with a second conductive material (e.g., gold, silver, nickel over-plated with gold, or tin over-plated with silver). The second conductive material may be formed on the base material by a film deposition process, such as chemical vapor deposition (CVD), spin-on, sputtering, or electroplating.

To assemble or disassemble the circuit members 101 and 102, a loading and unloading mechanism may be used. FIG. 1A illustrates one example of the loading and unloading mechanism (i.e., a loading and unloading mechanism 103), although other loading and unloading mechanisms may be used in other embodiments. The loading and unloading mechanism 103 may include a first plunger 114, a second plunger 115, a sliding component 116, and a spring 117. The sliding component 116 may be attached to the circuit member 101. The spring 117 may be attached to a support structure (not shown) of the system 100.

Figure 1D:
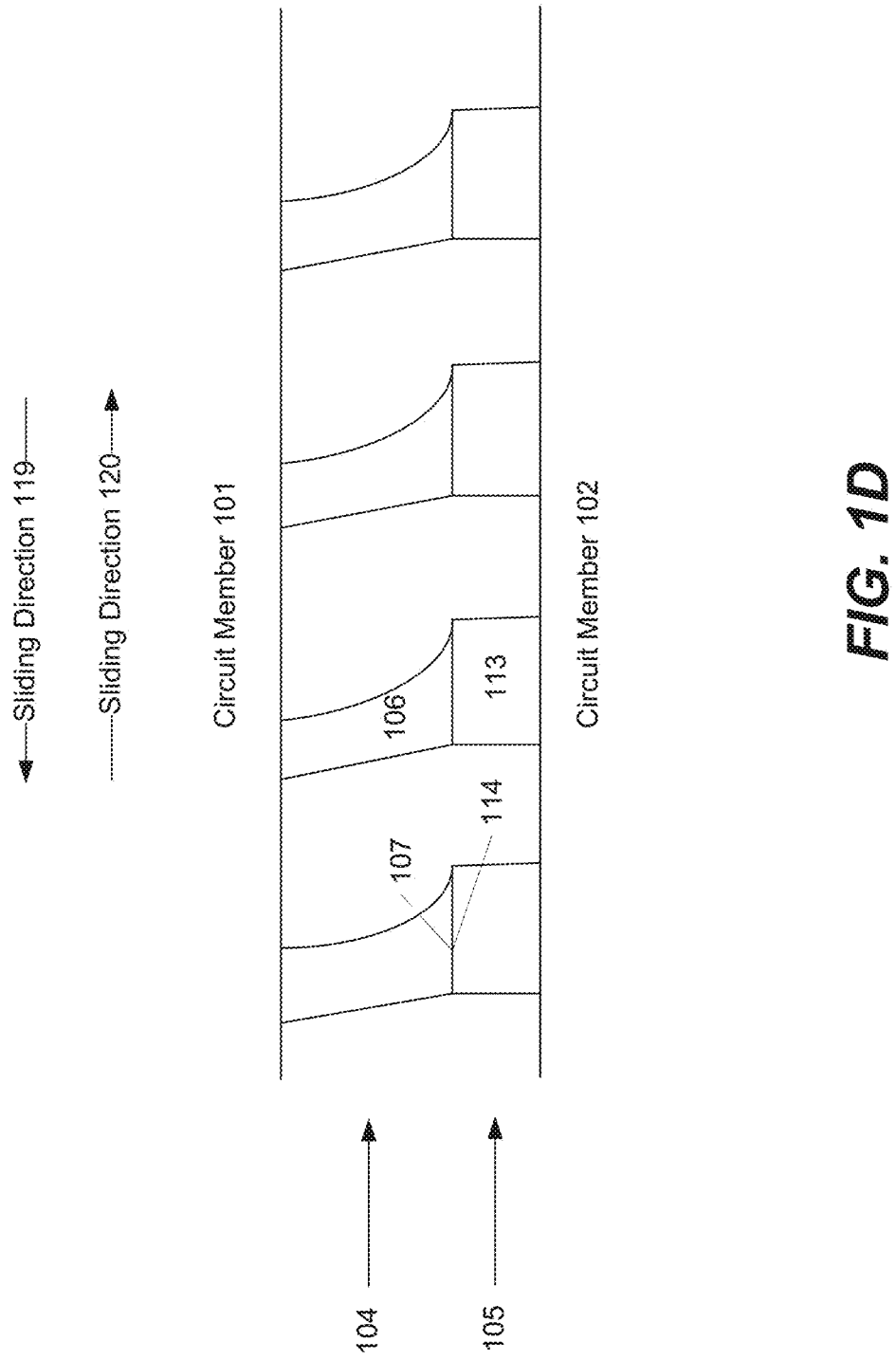
FIG. 1D is an enlarged side view of the electrically conductive connector of FIG. 1A illustrating the electrically conductive connector after contact surfaces of two circuit members are brought into physical contact and are slid relative to each other.

Referring to FIG. 1D, an enlarged side view of the electrically conductive connectors of FIG. 1A illustrating the electrically conductive connectors after contact surfaces of two circuit members are brought into physical contact and are slid relative to each other is shown. To assemble the circuit members 101 and 102, the first plunger 114 of FIG. 1A may be used to lower the circuit member 101 until the slanted contact surfaces 107 of the columnar structures 106 of the circuit member 101 are brought into physical contact with the mating contact surfaces 114 of the columnar structures 113 of the circuit member 102. The second plunger 115 of FIG. 1A may then be lowered until it contacts a slanted surface 118 of the sliding component 116. As the second plunger 115 continues to be lowered, the second plunger 115 slides along the slanted surface 118 of the sliding component 116, which, in response, pushes the sliding component 116 to move in a first direction (e.g., the direction 119). Potential energy may also be stored by compressing the spring 117. As a result, the slanted contact surfaces 107 of the columnar structures 106 of the circuit member 101 may slide relative to the contact surfaces 105 of the columnar structures 113 of the circuit member 102. Intermolecular bonds may be formed between the contact surfaces 105 and 107 of the circuit members 101 and 102 and van der Waals forces may hold the circuit members 101 and 102 together. Accordingly, electrical conduction paths may be established between the circuit members 101 and 102. A latching mechanism (not shown) may then be used to lock the assembly in a manner that prevents circuit member 101 to slide in a direction 120.

The assembly may subsequently be disassembled. For example, in a LGA assembly, when a defect is discovered in either a LGA module or a LGA circuit board, the LGA module or the LGA circuit board may be removed from the LGA assembly for replacement or repair. To disassemble the circuit members 101 and 102, a latching mechanism (not shown) may first be unlocked so that potential energy stored in the spring 117 of FIG. 1A may be released. When the potential energy is released, the spring 117 may push the circuit member 101 to move in the second direction (e.g., the direction 120) that is opposite to the first direction along which the contact surfaces 105 and 107 of the circuit members 101 and 102 were slid to be mated. As a result, the contact surfaces 105 and 107 of the circuit members 101 and 102 may be released and separated. Accordingly, the contact surfaces 105 and 107 of the circuit members 101 and 102 may be unmated. The plunger 114 may then be lifted so that the circuit members 101 and 102 may lose contact. Accordingly, electrical conduction paths between the circuit members 101 and 102 may be disconnected. The circuit member 101 or the circuit member 102 may subsequently be removed (e.g., for a replacement or a repair).

FIGS. 1A-D thus illustrate a system 100 that includes multiple circuit members (e.g., the circuit members 101 and 102) and a loading and unloading mechanism (e.g., the loading and unloading mechanism 103). The circuit members include electrically conductive connectors (e.g., the electrically conductive connector 104) that are capable of bonding contact surfaces of the circuit members via van der Waals forces. The system 100 enables the circuit members to be assembled or disassembled with relatively low insertion or extraction force so that potential damage to the circuit members during assembling or disassembling may be avoided. In addition, the system 100 is capable of reducing failures resulting from corrosion on contact surfaces of the circuit members since the electrically conductive connectors are made of a flexible material, which do not wear away a conductive material (e.g., gold) plated on the flexible material and thus oxidize an underlying layer material (e.g., nickel) or a base material (e.g., copper) as in a conventional connector.

Referring to FIG. 2, a flow chart of a particular embodiment of a method of using an electrically conductive connector to interconnect two circuit members via van der Waals forces and to establish electrical conduction paths between the two circuit members is shown and generally designated 200. The method 200 may be performed by using one or more devices or components of FIGS. 1A-D.

The method 200 may include engaging two circuit members (e.g., the circuit members 101 and 102 of FIGS. 1A-D), at 201, so that contact surfaces of the two circuit members (e.g., the slanted contact surfaces 107 of the columnar structures 106 of the circuit member 101 and the contact surfaces 105 of the columnar structures 102 of the circuit member 102) may be brought into physical contact. The contact surfaces of the two circuit members may be brought into physical contact by using a loading and unloading mechanism (e.g., the loading and unloading mechanism 103).

For example, the loading and unloading mechanism 103 may include a first plunger 114, a second plunger 115, a sliding component 116, and a spring 117. The first plunger 114 may physically contact a loading area 119 of the circuit member 101, which may be located on a surface of the circuit member 101 opposite from a surface on which the columnar structures 106 are located. Lowering the first plunger 114 may correspondingly lower the circuit member 101. The first plunger 114 may be lowered until the slanted contact surfaces 107 of the columnar structures 106 of the circuit member 101 are brought into physical contact with the contact surfaces 105 of the columnar structures 113 of the circuit member 102.

Moving to 202, the method 200 may include sliding a first circuit member (e.g., the circuit member 101 of FIGS. 1A-1D) relative to a second circuit member (e.g. the circuit member 102 of FIGS. 1A-1D) in a first direction (e.g., the direction 119 of FIG. 1D) so that the contact surfaces of the columnar structures of the first circuit member and the second circuit member are mated via van der Waals forces and electrical conduction paths are established between the first circuit member and the second circuit member.

For example, the second plunger 115 may be lowered until it contacts a slanted surface 118 of the sliding component 116. When the second plunger 115 continues to be lowered, the second plunger 115 may start to slide along the slanted surface 118 of the sliding component 116, which, in response, may push the circuit member 101 to move in a first direction (e.g., the direction 119). As a result, the slanted contact surfaces 107 of the circuit member 101 may slide relative to the contact surfaces 105 of the circuit member 102. Such relative motion may generate van der Waals forces that mate the contact surfaces of the circuit members 101 and 102. Accordingly, electrical conduction paths may be established between the circuit members 101 and 102.

Since the electrically conductive connector 104 is made of a flexible material, relative motions during assembling, disassembling, or operation do not wear away a conductive material (e.g., gold) plated on the flexible material and thus oxidize an underlying layer material (e.g., nickel) or a base material (e.g., copper) as in a conventional connector. Thus, using a flexible material in the columnar structures 106 enables the system 100 to reduce failures resulting from corrosion on contact surfaces 105 and 107 of the circuit members 101 and 102.

The method 200 thus enables the circuit members (e.g., the circuit members 101 and 102) to be assembled with relatively low insertion force to limit or prevent damage to the circuit members during assembling. In addition, the method 200 is capable of reducing failures resulting from corrosion on contact surfaces of the circuit members.

Referring to FIG. 3, a flow chart of a particular embodiment of a method of unmating contact surfaces of two circuit members that are mated via van der Waals forces and disconnecting electrical conduction paths between the two circuit members is shown and generally designated 300. The method 300 may be performed by using one or more devices or components of FIGS. 1A-D.

The method 300 may include, at 301, sliding a first circuit member (e.g., the circuit member 101) relative to a second circuit member (e.g., the circuit member 102) in a second direction (e.g., the direction 120) that is opposite to a first direction (e.g., the direction 119) along which the circuit members were slid to be mated.

For example, in the system 100 of FIGS. 1A-D, a latching mechanism (not shown) may be unlocked so that potential energy stored in the spring 117 may be released. When the potential energy is released, the spring 117 may push the circuit member 101 to move in a second direction (e.g., the direction 120) that is opposite to the first direction (e.g., the direction 119) along which the contact surfaces 105 and 107 of the circuit members 101 and 102 were slid to be mated. As a result, the contact surfaces 105 and 107 of the circuit members 101 and 102 are slid relative to each other and the van der Waals forces may be released. Accordingly, the contact surfaces 105 and 107 of the circuit members 101 and 102 may be unmated.

Moving to 302, the method 300 may include disengaging the first circuit member from the second circuit member so that electrical conduction paths between the first circuit member and the second circuit member are disconnected. For example, the plunger 114 may be lifted so that the circuit members 101 and 102 may lose contact. Accordingly, electrical conduction paths between the circuit members 101 and 102 may be disconnected. The circuit member 101 or the circuit member 102 may subsequently be removed (e.g., for a replacement or a repair).

The method 300 thus enables the circuit members (e.g., the circuit members 101 and 102) to be disassembled with relatively low extraction force to limit or prevent damage to the circuit members during disassembling.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An electrically conductive connector, comprising:
   a columnar structure having a body portion and an end portion, wherein the end portion is flexible and has a slanted contact surface, the columnar structure electrically coupled to a first circuit member,
   wherein an electrical conduction path is established between the first circuit member and a second circuit member upon the first circuit member slides relative to the second circuit member and when the slanted contact surface of the columnar structure mates with a contact surface of the second circuit member via van der Waals forces.

2. The electrically conductive connector of claim 1, wherein the body portion of the columnar structure has a cross-section area greater than a cross-section area of the end portion.

3. The electrically conductive connector of claim 2, wherein the columnar structure has a diameter within a range from 100 to 500 micrometers.

4. The electrically conductive connector of claim 1, wherein the columnar structure has a length within a range from 500 to 1000 micrometers.

5. The electrically conductive connector of claim 1, wherein the slanted contact surface has an angle within a range from 30 to 90 degree from a normal direction of a surface of the first circuit member.

6. The electrically conductive connector of claim 1, wherein the columnar structure has an angle within a range from 0 to 30 degrees from a normal direction of a surface of the first circuit member.

7. The electrically conductive connector of claim 1, wherein the columnar structure comprises a flexible material.

8. The electrically conductive connector of claim 7, wherein the flexible material comprises a polymer.

9. The electrically conductive connector of claim 8, wherein the polymer is selected from a group consisting of polyurethane, silicone, silicone, polydimethylsiloxane (PDMS), flexibilized epoxy resins, and acrylic resins.

10. The electrically conductive connector of claim 1, wherein the columnar structure is coated with a conductive material.

11. The electrically conductive connector of claim 10, wherein the conductive material comprises gold, silver, nickel over-plated with gold, or tin over-plated with silver.

12. The electrically conductive connector of claim 1, wherein the first circuit member comprises a module and the second circuit member comprises a circuit board.

13. The electrically conductive connector of claim 1, wherein the end portion of the columnar structure deforms upon mating of the columnar structure with the contact surface of the second circuit member.

14. An electrically conductive connector, comprising:
   one or more arrays of columnar structures, each columnar structure of the one or more array having a body portion and an end portion, wherein the end portion is flexible and has a slanted contact surface, wherein the columnar structures comprise a flexible material, wherein the columnar structures are coated with a conductive material, wherein the columnar structures are electrically coupled to devices and/or circuits on a first circuit member, and
   wherein electrical conduction paths are established between the first circuit member and a second circuit member upon the first circuit member slides relative to the second circuit member and when the slanted contact surfaces of the columnar structures of the first circuit member bond with corresponding contact surfaces of a second circuit member via van der Waals forces.

15. The electrically conductive connector of claim 14, wherein the first circuit member and the second circuit member comprise land grid array (LGA) packages, and wherein each columnar structure of the first circuit member corresponds to one contact surface of the second circuit member.

16. The electrically conductive connector of claim 14, wherein the end portion is made of a flexible material comprising a polymer.

17. The electrically conductive connector of claim 14, wherein the end portions deform upon mating of the one or more arrays of columnar structures with the corresponding contact surfaces of the second circuit members.

18. The electrically conductive connector of claim 14, wherein the columnar structures have a uniform structure.

19. A method, comprising:
   engaging a first circuit member with a second circuit member so that contact surfaces of columnar structures of the first circuit member are brought into physical contact with contact surfaces of the second circuit member; and
   sliding the first circuit member relative to the second circuit member in a first direction so that slanted contact surfaces of the columnar structures of the first circuit member and the contact surfaces of the second circuit member are mated via van der Waals forces and electrical conduction paths are established between the first circuit member and the second circuit member.

20. The method of claim 19, further comprising:
   sliding the first circuit member relative to the second circuit member in a second direction so that the slanted contact surfaces of the columnar structures of the first circuit member and the contact surfaces of the second circuit member are unmated, wherein the second direction is opposite to the first direction; and
   disengaging the first circuit member from the second circuit member so that the electrical conduction paths are disconnected.

* * * * *